United States Patent
Li et al.

(10) Patent No.: US 7,385,425 B1
(45) Date of Patent: Jun. 10, 2008

(54) PRINTED CIRCUIT UNIT BASED ON ORGANIC TRANSISTOR

(75) Inventors: Chin-Fu Li, Puyan Township, Changhua County (TW); Chih-Hung Lin, Gueiren Township, Tainan County (TW); Jiunn-Tsair Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/675,087

(22) Filed: Feb. 15, 2007

(30) Foreign Application Priority Data

Dec. 18, 2006 (TW) .............................. 95147428 A

(51) Int. Cl.
*H03K 19/094* (2006.01)
*H03K 3/00* (2006.01)

(52) U.S. Cl. .................... 326/83; 326/81; 326/104; 327/112

(58) Field of Classification Search .................. 326/83, 326/68, 81, 104; 327/112
See application file for complete search history.

(56) References Cited

U.S. PATENT DOCUMENTS 6,661,299 B2 * 12/2003 Dodabalapur et al. ........ 331/57
7,030,666 B2 * 4/2006 Brazis et al. ................ 327/112
2005/0162206 A1 * 7/2005 Kimura ....................... 327/203
2005/0189968 A1 * 9/2005 Brazis et al. ................ 327/112
2007/0035340 A1 * 2/2007 Kimura ....................... 327/524

OTHER PUBLICATIONS

M. G. Kane, et al. IEEE Electron Device Letters, vol. 21, No. 11, Nov. 2000 "Analog and Digital Circuits Using Organic Thin-Film Transistors on Polyester Substrates" pp. 534-536.
Hagen Klauk, et al. IEEE Electron Device Letters, vol. 20M, No. 6, Jun. 1999 "Fast Organic Thin-Film Transistor Circuits" pp. 289-291.
R. Brederlow, et al. IEEE International Solid-State Circuits Conference "Evaluation of the Performance Potential of Organic TFT Circuits" 2003/Session 21/ Paper 21.6.
Qing Wu, et al. ISCAS 2006 "Design Considerations for Digital Circuits Using Organic Thin Film Transistors on a Flexible Substrats" pp. 1267-1270.

* cited by examiner

*Primary Examiner*—Vibol Tan
(74) *Attorney, Agent, or Firm*—Jianq Chyun IP Office

(57) ABSTRACT

A printed circuit unit implementing with organic transistors is provided. The printed circuit unit includes an input signal circuit, a load circuit and a level shifter. The input signal circuit includes N serially connected organic transistors. When one of the serially connected organic transistors is cut-off, the signal input circuit is cut-off, so that the circuit is maintained to output a correct voltage level. The level shifter circuit includes an organic transistor having a gate for receiving the input signal. The organic transistor can also serve as a load for improving a gain of the level shifter.

12 Claims, 5 Drawing Sheets

PRINTED CIRCUIT UNIT BASED ON ORGANIC TRANSISTOR

CROSS-REFERENCE TO RELATED APPLICATION

This application claims the priority benefit of Taiwan application serial no. 95147428, filed Dec. 8, 2006. All disclosure of the Taiwan application is incorporated herein by reference.

BACKGROUND OF THE INVENTION

1. Field of the Invention

The present invention relates to a printed circuit unit based on an organic transistor.

2. Description of Related Art

As science and technology advance, many information equipments, such as radio frequency identification (RFID) tags, are being developed and are available on the market, which brings great convenience to human beings. RFID tags can be used in shopping malls, logistics industry, and traffic transportation. However, processing of the conventional inorganic chips for such products is complicated and expensive, and therefore a trade off between convenience and cost is hard to realize when considering the demand for low cost and mass production.

Accordingly, organic material related processing technologies that are relatively simple are currently continuously developed and proposed in order to achieve better convenience, circuit stable and lower production cost by directly printing logical circuits onto films regardless occupation of circuit area.

FIG. 1 illustrates a threshold voltage distribution range of a conventional printed organic transistor. Referring to FIG. 1, the threshold voltage of the printed organic transistor is likely to be affected by processing factors thereof to drift. It is to be noted that the threshold voltage drifts in a very large range, which distribution can be simulated like a Gaussian curve.

FIG. 2 is schematic diagram illustrating a circuit of a conventional printed inverter based on an organic transistor. Referring to FIG. 2, the printed inverter based on organic transistor includes a gain stage circuit 202 and a level shifter circuit 204. The gain stage circuit 202 includes organic transistors 211 and 213. The organic transistor 211 has a first source/drain, a second source/drain and a gate. The gate of the organic transistor 211 receives an input signal Vin, and the first source/drain is connected to a power source voltage Vdd. The organic transistor 213 has a first source/drain, a second source/drain and a gate. The first source/drain and the gate of the organic transistor 213 are both connected to a ground voltage. The level shifter circuit 204 includes an organic transistor 215 and an organic transistor 217. The organic transistor 215 includes a first source/drain, a second source/drain, and a gate. The gate of the organic transistor 215 is connected to the ground voltage, and the first source/drain of the organic transistor 215 is connected to the power source voltage Vdd. The organic transistor 217 includes a first source/drain, a second source/drain, and a gate. The first source/drain of the organic transistor 217 is connected to the second source/drain of the organic transistor 215, while the second source/drain and the gate of the organic transistor 217 are connected to the ground voltage and the second source/drain of the organic transistor 211, respectively.

FIG. 3 is a schematic diagram illustrating output signals of a conventional three stage serially cascaded printed inverter. Referring to FIG. 3, under a condition that a standard deviation is 2, the yield of the three-stage serially cascaded printed circuit unit is 94.5%, wherein a larger standard deviation means a larger drifting value of the threshold voltage of the organic transistor. FIG. 3 shows a lower output voltage distribution when the logical output is a low level and a higher output voltage distribution when the logical output is a high level.

Additionally, Kane M. G et al. proposed employing differential circuits for inverters ("Analog and digital circuits using organic thin-film transistors on polyester substrates", IEEE Electron Device Letters, Vol. 21, Issue 11, pp. 534-536, November 2000). In this design the differential circuits generally more stable than single-ended circuits.

FIG. 4 is a schematic diagram illustrating output signals of a conventional three stage differential circuit serially cascaded printed inverter. Referring to FIG. 4, under a condition that a standard deviation is 2, the yield of the three-stage serially cascaded printed inverter by differential circuits is 97.3%. The yield of the serially cascaded three-stage printed inverters by differential circuits is improved to some degree compared to the conventional.

SUMMARY OF THE INVENTION

Accordingly, examples of the present invention may direct to a printed circuit unit implementing with organic transistors for improving a tolerance of the logical circuit noise margin.

Examples of the present invention may also direct to a printed NAND gate, implementing with organic transistors, for reducing function fault caused by the threshold voltage drifting.

Examples of the invention may provide a printed circuit unit including a signal input circuit, a load circuit and a level shifter circuit. The signal input circuit includes N number of serially connected organic transistors, each of which has a first source/drain, a second source/drain, and a gate. Each of the second sources/drains of the $1^{st}$ to the N-$1^{th}$ organic transistors is respectively connected to the first source/drain of an immediately adjacent serially connected organic transistor. The gates of all organic transistors are connected together for receiving an input signal. The first source/drain of the $1^{st}$ organic transistor is connected to a first voltage, and the second source/drain of the N$^{th}$ organic transistors is connected to the load circuit, wherein N is an integer greater than 1. Further, the level shifter circuit is connected to the signal input circuit for adjusting the output voltage of the second source/drain of the N$^{th}$ organic transistor to shift to a predetermined level.

Examples of the invention may provide a printed NAND gate implementing with organic transistors. The printed NAND gate includes a plurality of sets of signal input circuits, a load circuit and a level shifter circuit. Each signal input circuit set includes N number of serially connected organic transistors. Each organic transistor includes a first source/drain, a second source/drain, and a gate. Each of the second sources/drains of the $1^{st}$ to the N-$1^{th}$ organic transistor is respectively connected to the first source/drain of an immediately adjacent serially connected transistor. The gates of the $1^{st}$ to the N$^{th}$ organic transistors are connected together for receiving an input signal. The first sources/drains of the $1^{st}$ organic transistors are connected to a first voltage, wherein N is an integer greater than 1. Further, the load circuit is connected to the second sources/drains of the N$^{th}$ transistors of each of the above sets of signal input circuits, and the level shifter circuit is connected to each set of signal input circuit for adjusting the output voltage of the second source/drain of the $N^{th}$ organic transistor to shift to a predetermined level.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
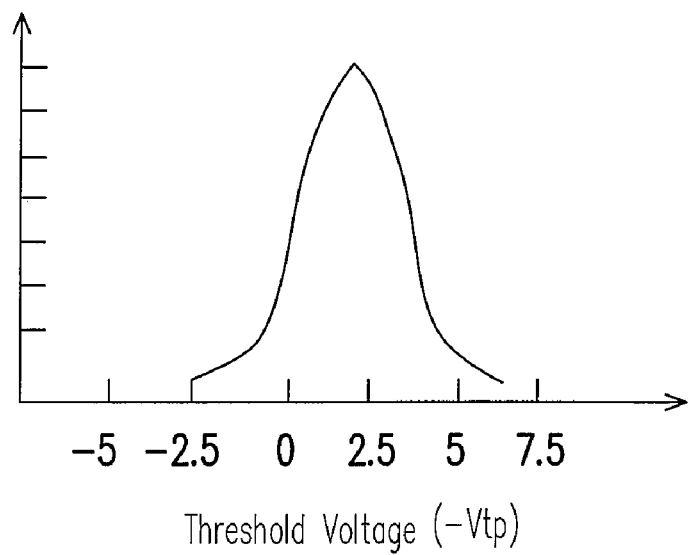
FIG. 1 illustrates a threshold voltage distribution range of a conventional printed circuit organic transistor.
Figure 2:
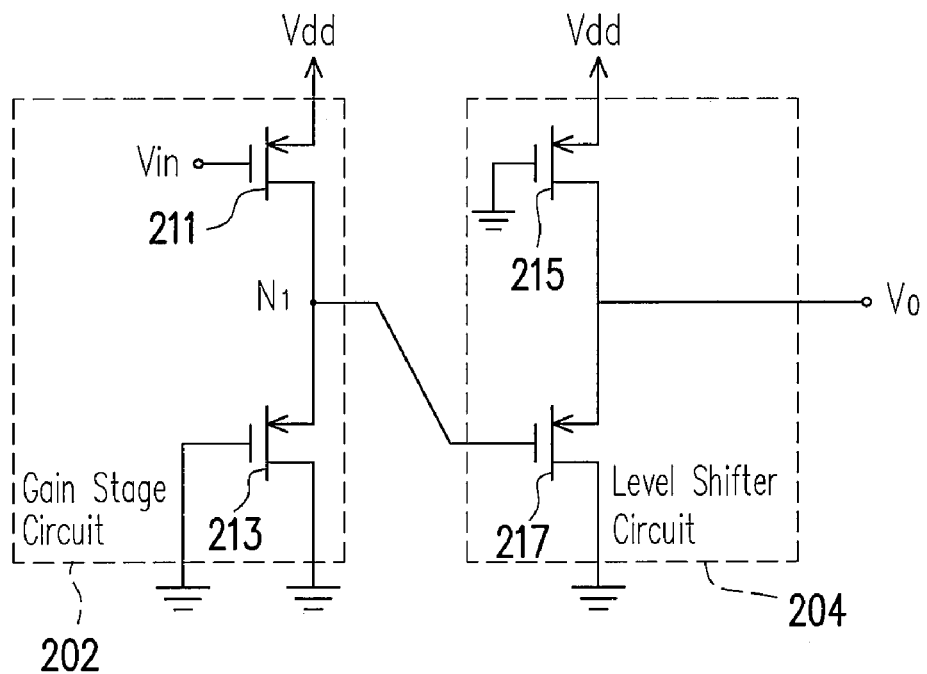
FIG. 2 is a schematic diagram illustrating a circuit of a conventional printed inverter based implementing with organic transistors.
Figure 3:
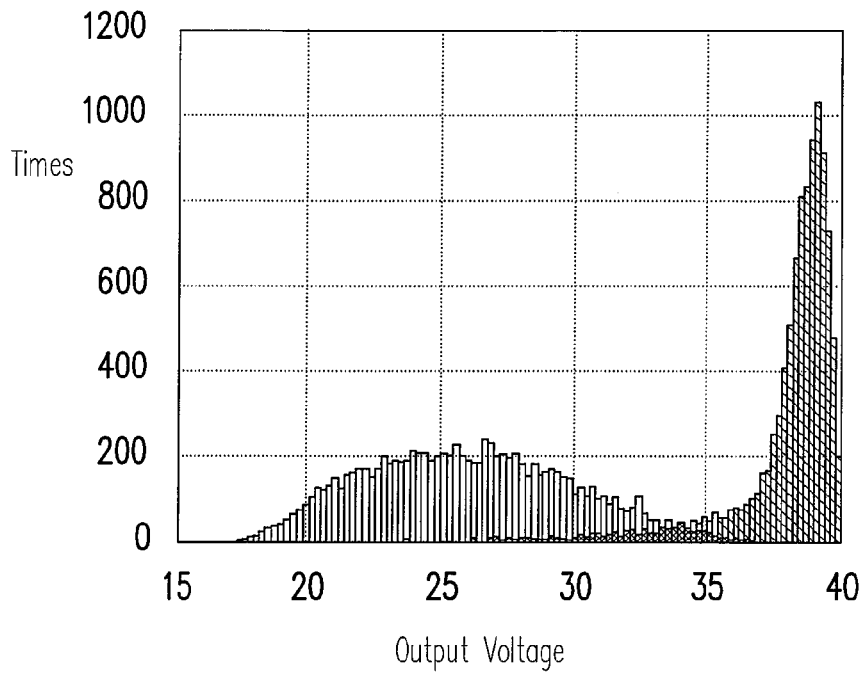
FIG. 3 is a schematic diagram illustrating output signals of a conventional three stage serially cascaded printed inverter.
Figure 4:
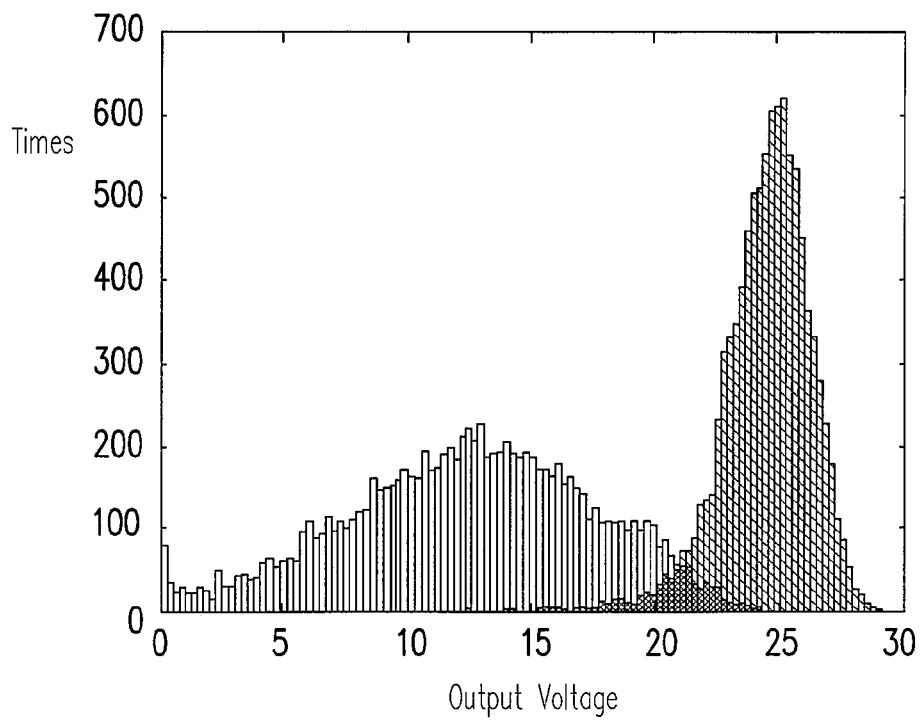
FIG. 4 is a schematic diagram illustrating output signals of a conventional three stage differential circuit serially cascaded printed inverter.

Reference will now be made in detail to the present embodiments of the invention, examples of which are illustrated in the accompanying drawings. Wherever possible, the same reference numbers are used in the drawings and the description to refer to the same or like parts.

Figure 5:
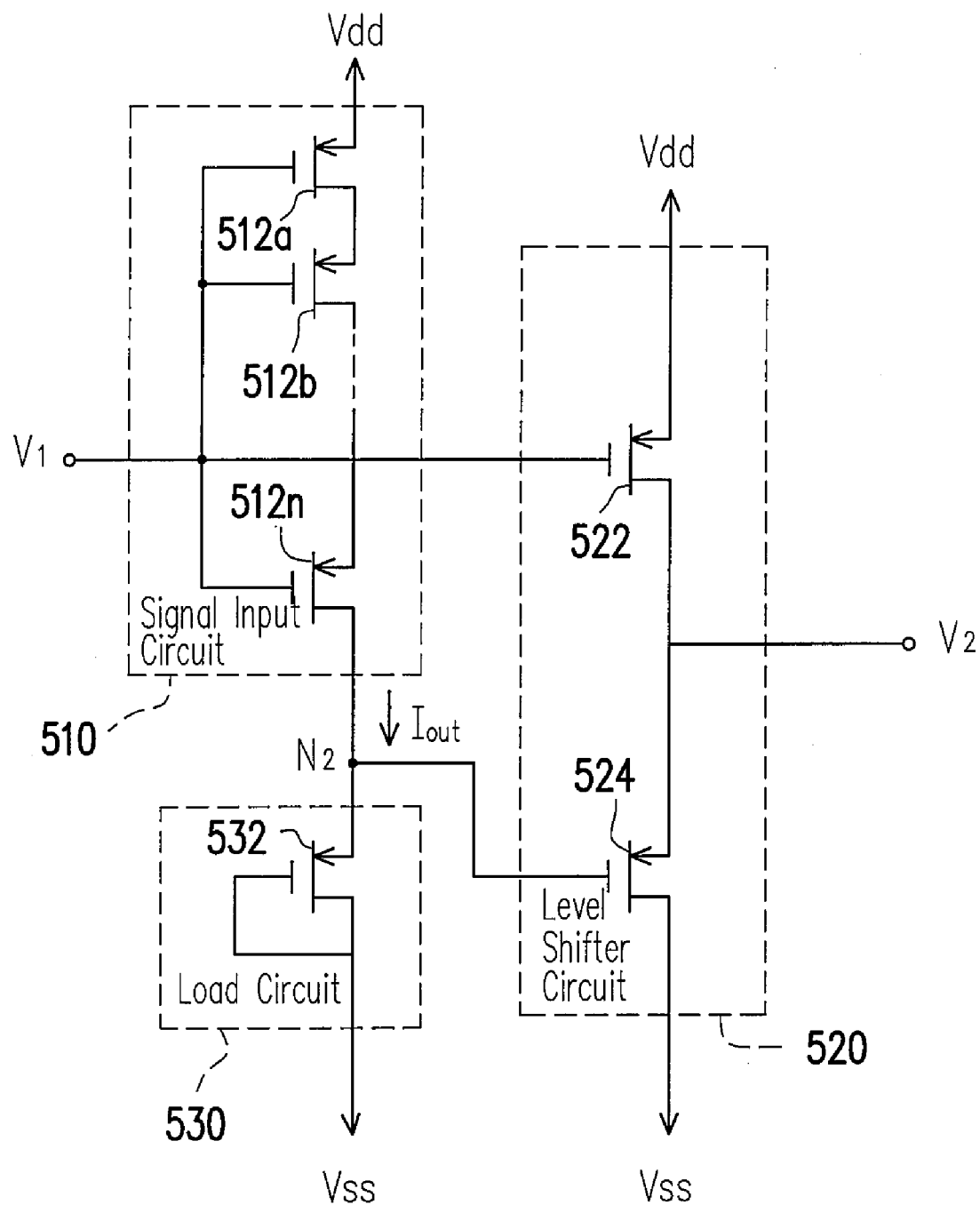
FIG. 5 is a schematic diagram illustrating a circuit of a printed circuit unit implementing with organic transistors according to an example of the present invention.

FIG. 5 is a schematic diagram illustrating a circuit of a printed circuit unit implementing with organic transistors according to an embodiment of the present invention. An inverter is exemplified for illustration, and it is to be noted that this is not intended to limit the scope of the present invention, while the present invention can also be applied in other logical gates. Referring to FIG. 5, the printed circuit unit includes a signal input circuit 510, a level shifter circuit 520 and a load circuit 530. The signal input circuit 510 is composed of N number of serially connected organic transistors 512a through 512n, and the load circuit 530 provides required load thereto. Further, the voltage at the node at which the signal input circuit 510 and the load circuit 530 connected to each other can be shifted to a predetermined level by the level shifter circuit 520. N is an integer greater than 1.

Referring to FIG. 5, each of the organic transistors 512a through 512n of the signal input circuit 510 includes a first source/drain, a second source/drain, and a gate. The second source/drain of each of the first through the N-1$^{th}$ organic transistors is respectively connected to the first source/drain of the immediately adjacent serially connected organic transistor. All gates of the organic transistors are connected together for receiving an input signal V1. Further, the first source/drain of the first organic transistor 512a is connected to a first voltage, for example a power source voltage Vdd, while the second source/drain of the last organic transistor 512n is connected to a first source/drain of a load organic transistor 532. A gate of the load organic transistor 532 is connected to a second source/drain thereof and a second voltage, the second voltage, for example, is a ground voltage Vss. Furthermore, the load organic transistor 532 may serve as a load of the signal input circuit 510.

When the gates of the organic transistors 512a through 512n receive an input signal V1 to conduct the organic transistors 512a through 512n, a trans-conducting current Iout flows to the load organic transistor 532. Comparatively, when the gates of the organic transistors 512a through 512n receive an input signal V1, which cut-off the organic transistors 512a through 512n, the trans-conducting current Iout is cut-off accordingly.

The present invention provides a solution toward the problem of unable to cut-off organic transistor because of the drift of organic transistor threshold voltage by employing N serially connected transistors 512a through 512n. As shown in FIG. 5, the trans-conducting current Iout is a minimum value among the currents generated by all of those organic transistors 512a through 512n.

$$Iout=Min.\{Im1, Im2, \ldots Imn\} \quad (1),$$

Wherein, the $1^{st}$ organic transistor 512a generates a current Im1, the $2^{nd}$ organic transistor 512b generates a current Im2, and likewise the $N^{th}$ organic transistor 512n generates a current Imn. When the threshold voltage of one of the organic transistors 512a through 512n drifts, even a high level input signal V1 is received by the gate of the organic transistor, the organic transistor cannot be cut-off. However, the signal input circuit 310 of the present invention is constituted by N serially connected organic transistors, so that if one of the organic transistors is cut-off, the trans-conducting current Iout of the signal input circuit 510 is still cut-off even when one of the organic transistor cannot be cut-off as expected.

Still referring to FIG. 5, the level shifter circuit 520 includes a gain organic transistor 522 and a level shifter organic transistor 524. The gain organic transistor 522 includes a first source/drain, a second source/drain and a gate. The gate of the gate organic transistor 522 receives an input signal V1, and the first source/drain is connected to a first voltage. The level shifter organic transistor 524 includes a first source/drain, a second source/drain and a gate. The first source/drain of the level shifter organic transistor 524 is connected to the second source/drain of the gain organic transistor 522. The first source/drain and the gate of the level shifter organic transistor 524 are respectively connected to a second voltage and the second source/drain of the organic transistor 512n. Practically, all organic transistors employed in the embodiment of the present invention are exemplified with PMOS transistors. However, the present invention is not limited thereto, other types of organic transistors can also be used in accordance with the present invention to achieve the purpose of the present invention, which shall also be construed to be with the scope of the present invention.

The gate of the gain organic transistor 522 receives the input signal, so that the gain organic transistor 522 not only serves as a load, but can also be used to raise the gain of the level shifter circuit 520 to reduce the noise of the level shifter circuit 520. As such, the affection to the circuit by lowering the threshold voltage drift can be reduced.

Figure 6:
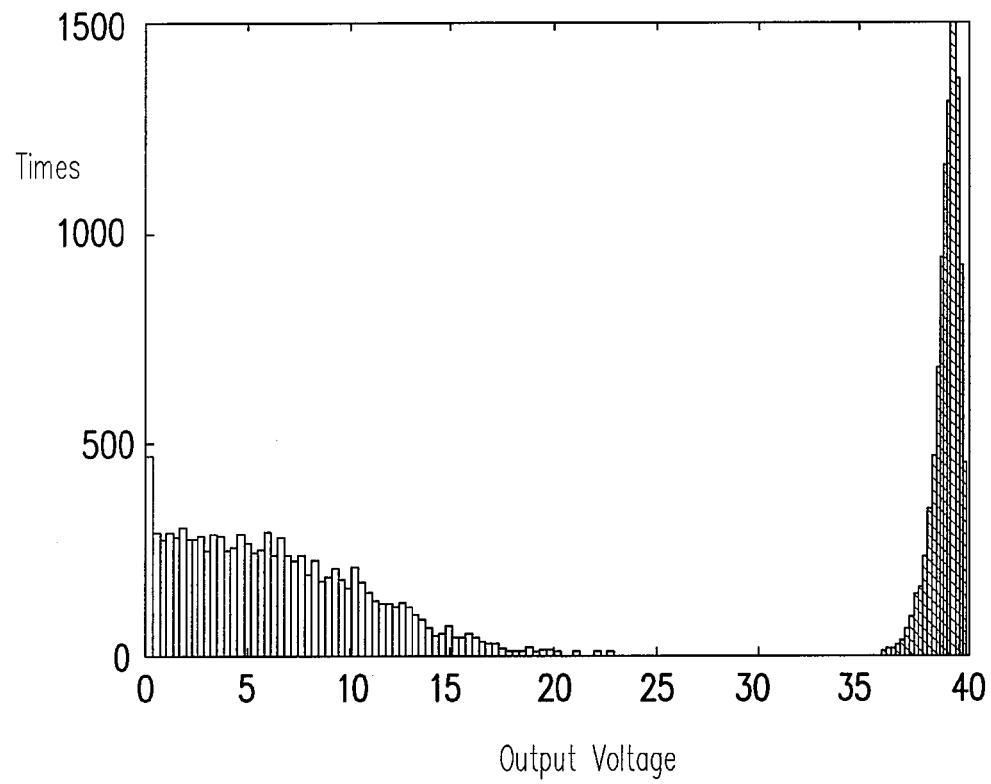
FIG. 6 is a schematic diagram illustrating output signals of a three-stage serially cascaded printed inverter according to an example of the present invention.

FIG. 6 is a schematic diagram illustrating output signals of a three-stage serially connected printed inverter according to an embodiment of the present invention. Referring to FIG. 6, under a condition that a standard deviation is 2, the yield of circuit unit of the three-stage serially cascaded is 99.9%. As shown in FIG. 6, there is no overlap between the distribution of the high level and low level. As such, judgement fault on the output logical signal can be avoided. Furthermore, compared to conventional printed inverters, the printed circuit unit of the present invention has a better yield and larger noise margin.

Figure 7:
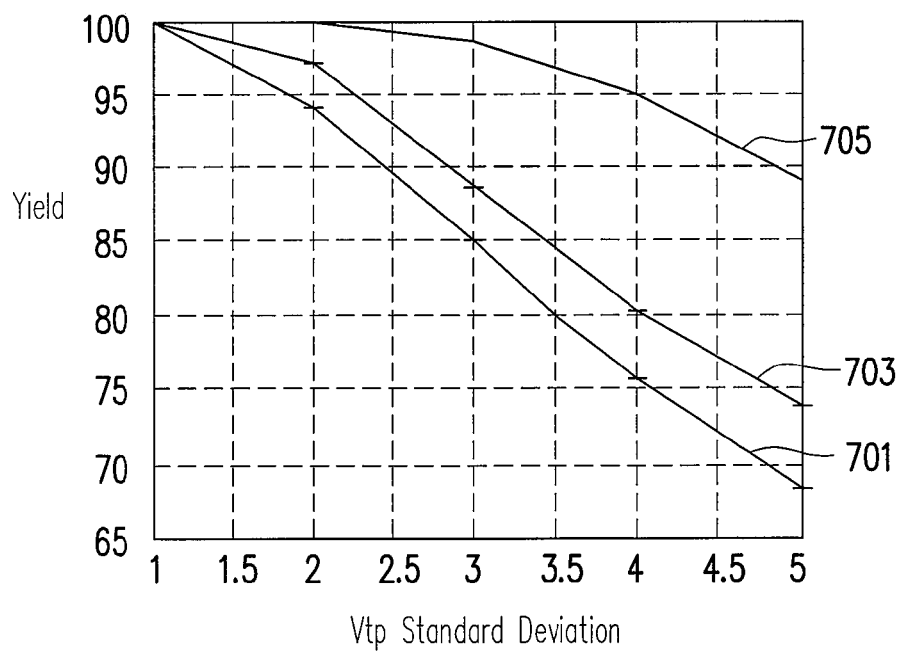
FIG. 7 is a schematic diagram illustrating yield comparisons of conventional, differential and an example of present inventive inverters.

FIG. 7 is a schematic diagram illustrating a yield of three-stage serially cascaded printed inverters according to an embodiment of the present invention. Referring to FIG. 7, a yield curve 701 for a conventional printed inverter, a yield curve 703 for a printed inverter by differential circuits and a yield curve 707 for a printed circuit unit are shown according to an embodiment of the present invention. As shown in FIG. 7, under a condition that a standard deviation is 2, the yield of the conventional three-stage serially cascaded is 94.5%; the yield of the three-stage serially cascaded printed inverter by differential circuit is 97.3%; and the yield of the three-stage serially cascaded present inventive circuit unit is 99.9%. The yields shown in FIG. 7 are not very much different from one another. However, as the standard deviation increases, or more printed inverters are serially cascaded, the difference among the yields will be significant. For example, a complexity of a current RFID tag is equivalent to 45-stage serially cascaded printed inverters. The yield of the three-stage serially cascaded present inventive circuit unit is 99.9%, and similarly it is deduced that a yield of a 45-stage serially cascaded printed circuit unit would be 98.5%. However, the yield of a conventional 45-stage serially cascaded printed inverters is 43%, and the yield of a 45-stage serially cascaded printed inverters by differential circuits is 67%. Accordingly, the printed circuit unit according to the embodiment of the present invention is adapted for RFID tags.

Figure 8:
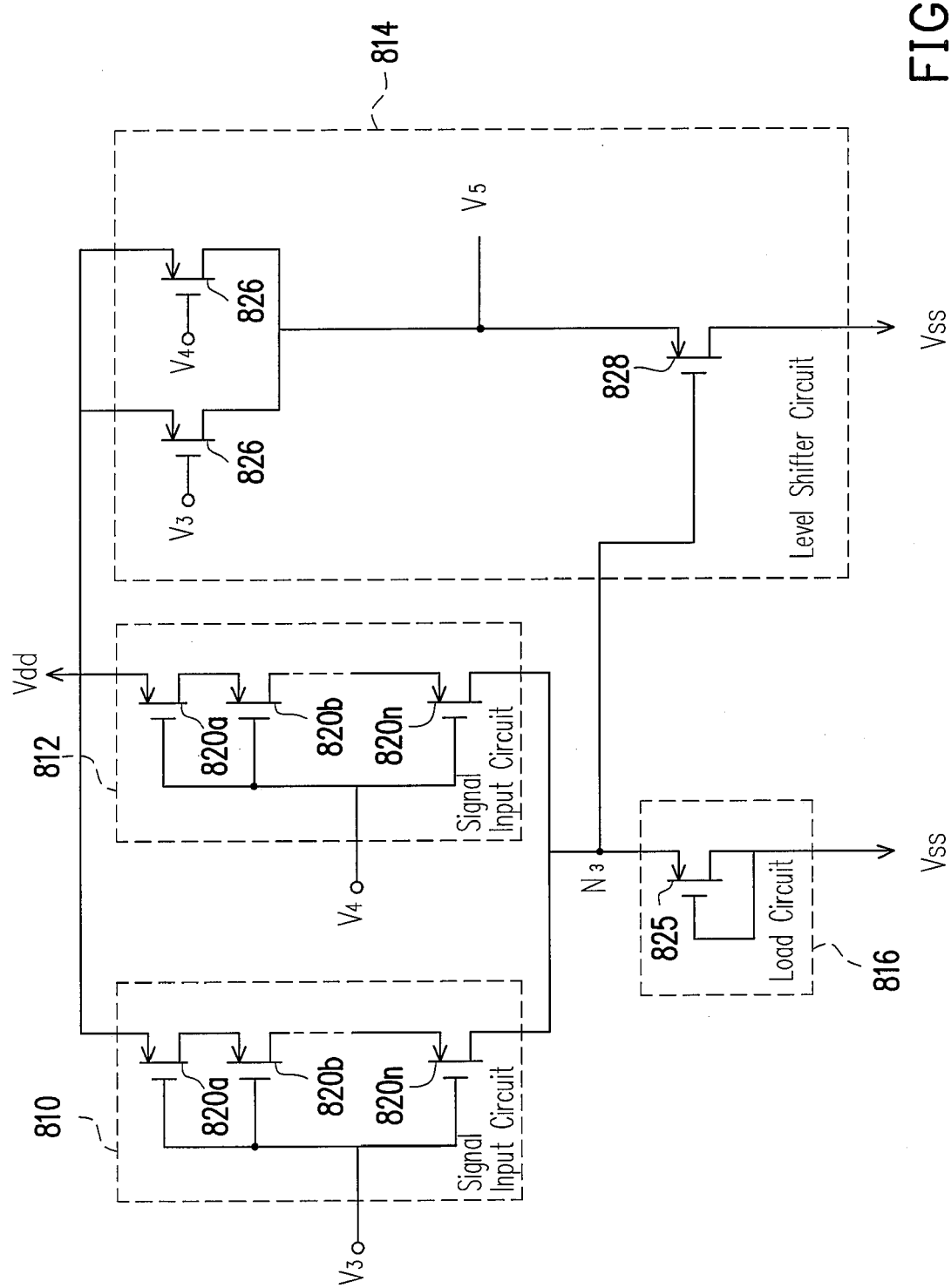
FIG. 8 is a schematic diagram illustrating a circuit of a printed NAND gate implementing with organic transistors according to an example of the present invention.

FIG. 8 is schematic diagram illustrating a circuit of a printed NAND gate implementing with organic transistors according to an embodiment of the present invention. Referring to FIG. 8, the printed NAND gate according to an embodiment of the present invention includes a plurality of signal input circuits, a level shifter circuit 814 and a load circuit 816. For illustration purpose, only two signal input circuits 810 and 812 are exemplified in FIG. 8. Each of signal input circuits 810 and 812 includes N serially connected organic transistors. The load circuit 816 provides required load. The load circuit 816 includes a load organic transistor 825. The load organic transistor 825 includes a first source/drain, a second source/drain and a gate. Further, the voltage at the node at which the signal input circuits 810 and 812 and the load circuit 816 connected to each other can be shifted to a predetermined level by the level shifter circuit 814.

Still referring to FIG. 8, each of the signal input circuits 810 and 812 includes a plurality of organic transistors 820a through 820n. Each of the organic transistors 820a through 820n includes a first source/drain, a second source/drain and a gate. Each of the second sources/drains of the $1^{st}$ to the $N-1^{th}$ organic transistors is connected to the first source/drain of the immediately adjacent serially connected organic transistor. All gates of the organic transistors of each of the signal input circuits 810 and 820 are connected together for respectively receiving signals V3 and V4. The first source/drain of the $1^{st}$ organic transistor 820a is connected to a first voltage, e.g., Vdd, and the second source/drain of the last organic transistor 820n is connected to the first source/drain of the load organic transistor 825. The gate of the load organic transistor 825 is connected to the second source/drain of the load organic transistor 825, and a second voltage, e.g., ground voltage Vss. The load organic transistor 825 can serve as a load of the signal input circuits 810 and 812.

The present embodiment includes two signal input circuits 810 and 812. Accordingly, the level shifter circuit 814 includes a gain organic transistor 826 and a level shifter organic transistor 828 that are connected in parallel. The level shifter organic transistor 828 includes a first source/drain, a second source/drain and a gate. The second source/drain and gate of the level shifter organic transistor 828 are respectively connected to the second voltage and the first source/drain of the load organic transistor 825. The first sources/drains of all gain organic transistors 826 are connected together to the first voltage, and the second source/drains of all gain organic transistors 826 are connected together to the first source/drain of the level shifter organic transistor 828, the gates of the organic transistors receiving corresponding input signals.

Table 1 shows outputs of the printed NAND gate in response to different input signals, where "0" means that the corresponding input signal is at a low level, and "1" means the corresponding input signal is at a high level.

TABLE 1

| V3 | V4 | V5 |
|---|---|---|
| 1 | 1 | 0 |
| 1 | 0 | 1 |
| 0 | 1 | 1 |
| 0 | 0 | 1 |

According to Table 1, when the input signals V3 and V4 are both of high level, also as shown in FIG. 8, the organic transistors (820a through 820n, and 826) are cut-off, and therefore the output current Iout is also cut-off. As such, the output voltage V5 is a low level signal. Those skilled in the art would be able to understand the outputs are responsive to other different input signals, therefore the situations thereof are not to be iterated hereby. Finally, according to the data listed in Table 1, it is concluded that the circuit illustrated in FIG. 8 is a NAND circuit.

In summary, the present invention provides printed circuit unit implementing with organic transistors. A signal input circuit of the printed circuit unit includes N serially connected organic transistors. When one of the organic transistors is cut-off, the rest transistors are also cut-off. As such, even though a threshold voltage of one of the organic transistor drifts, the organic transistor is still cut-off, so as to maintain routine operation of the circuit. Furthermore, the level shifter circuit according to the present invention includes a gain organic transistor having a gate connected to the input signal, or a plurality of parallel connected gain organic transistors, by which not only the gain of the circuit is increased but also the noise margin of the circuit can be extended.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A printed circuit unit, comprising:
 a signal input circuit, comprising N serially connected organic transistors, each of the organic transistors having a first source/drain, a second source/drain and a gate, wherein each of the second sources/drains of the $1^{st}$ to the N-$1^{th}$ organic transistors is respectively connected to the first source/drain of an immediately adjacent serially connected organic transistor, and the gates of the organic transistors are connected together to receive an input signal, and the first source/drain of the $1^{st}$ organic transistor is connected to a first voltage, and wherein N is an integer greater than 1;
 a load circuit, connected to the second source/drain of the $N^{th}$ organic transistor for providing a load; and
 a level shifter circuit, connected to the signal input circuit, for adjusting an output voltage of the second source/drain of the $N^{th}$ organic transistor to shift to a predetermined level.

2. The printed circuit unit according to claim 1, wherein the level shifter circuit comprises:
 a gain organic transistor, having a first source/drain connected to the first voltage, a second source/drain, and a gate for receiving the input signal; and
 a level shifter organic transistor, having a first source/drain connected to the second source/drain of the gain organic transistor, a second source/drain connected to a second voltage, and a gate connected to the second source/drain of the $N^{th}$ organic transistor.

3. The printed circuit unit according to claim 1, wherein the load circuit is a load organic transistor, the load organic transistor comprises a first source/drain connected to the second source/drain of the $N^{th}$ organic transistor, a second source/drain and a gate, and wherein the second source/drain of the load organic transistor is connected to the gate of the load organic transistor and the second voltage.

4. The printed circuit unit according to claim 3, wherein all of the organic transistors comprise PMOS transistors.

5. The printed circuit unit according to claim 2, wherein the first voltage is a power source voltage, and the second voltage is a ground voltage.

6. The printed circuit unit transistors according to claim 1, wherein the printed circuit unit is an inverter.

7. The printed circuit unit based on organic transistors according to claim 1, wherein the printed circuit unit is a logical gate.

8. A printed NAND gate, comprising:
 a plurality of signal input circuits, each signal input comprising N serially connected organic transistors, each of the organic transistors comprising a first source/drain, a second source/drain and a gate, wherein each of the second sources/drains of the $1^{st}$ to the N-$1^{th}$ organic transistors is respectively connected to the first source/drain of an immediately adjacent serially connected organic transistor, and the gates of the organic transistors are connected together to receive an input signal, and the first source/drain of the $1^{st}$ organic transistor is connected to a first voltage, wherein N is an integer greater than 1;
 a load circuit, connected to the second source/drain of the $N^{th}$ organic transistor of each of the plurality of signal input circuits, for providing a load; and
 a level shifter circuit, connected to each of the signal input circuits, for adjusting an output voltage of the second source/drain of the $N^{th}$ organic transistor of each of the signal input circuits to shift to a predetermined level.

9. The printed NAND gate according to claim 8, wherein the level shifter circuit comprises:
 a plurality of gain organic transistors, connected in parallel, each gain organic transistor comprising a first source/drain connected to the first voltage, a second source/drain, and a gate for receiving the input signal, wherein the first sources/drains of the gain organic transistors are connected together to a first voltage, the second sources/drains of the gain organic transistors are connected together, and the gates of the gain organic transistors are receiving the input signal; and
 a level shifter organic transistor, comprising a first source/drain connected to the second sources/drains of parallel connected gain organic transistors, a second source/drain connected to a second voltage, and a gate connected to the second source/drain of the $N^{th}$ organic transistor of each of the signal input circuits.

10. The printed NAND gate according to claim 9, wherein the load circuit is a load organic transistor, the load organic transistor comprises a first source/drain connected to the second source/drain of the $N^{th}$ organic transistor of each of the plurality of signal input circuits, a second source/drain and a gate, wherein the second source/drain of the load organic transistor is connected to the gate of the load organic transistor and the second voltage.

11. The printed circuit unit according to claim 10, wherein the organic transistors comprise PMOS transistors.

12. The printed circuit unit according to claim 9, wherein the first voltage is a power source voltage, and the second voltage is a ground voltage.

* * * * *